(12) United States Patent
Frutschy

(10) Patent No.: US 7,187,066 B2
(45) Date of Patent: Mar. 6, 2007

(54) RADIANT ENERGY HEATING FOR DIE ATTACH

(75) Inventor: Kristopher J. Frutschy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/947,515

(22) Filed: Sep. 22, 2004

(65) Prior Publication Data

US 2006/0060979 A1   Mar. 23, 2006

(51) Int. Cl.
H01L 23/02 (2006.01)
H01L 23/06 (2006.01)
H01L 23/48 (2006.01)
H01L 23/52 (2006.01)
H01L 29/40 (2006.01)

(52) U.S. Cl. .................. 257/678; 257/684; 257/738; 257/778

(58) Field of Classification Search ............... 257/678, 257/684–690, 737–738, 778–786
See application file for complete search history.

(56) References Cited

U.S. PATENT DOCUMENTS

| | | | |
|---|---|---|---|
| 6,394,158 B1 | 5/2002 | Momeni | |
| 6,644,536 B2 | 11/2003 | Ratificar et al. | |
| 2002/0141533 A1* | 10/2002 | Kitaoka | 378/34 |
| 2004/0016752 A1 | 1/2004 | Ratificar et al. | |

OTHER PUBLICATIONS

"Intelligence comes to laser soldering," Electronics, Jul. 10, 1986, pp. 75-77.
"Application of lasers to microsoldering of SMDs to PWBs," International Symposium on Microelectronics, Anaheim, Nov. 11-14, 1985, pp. 405-429.
"Laser soldering for electronic packaging," Wayne M. Penn, Bob Butts, Penn Research Corporation, pp. 399-404.
"Laser microsoldering," F. Burns, C. Zyetz, Apollo Lasers, Inc., Electronic Packaging and Production, Interconnection, May, 1981, pp. 109-120.
"Rapid die heating for low-stress die attach," IEEE Transactions on Device and Materials Reliability, vol. 4, Issue 2, Jun. 2004, pp. 153-162.
Lee, Hyeon-Deok, "Interconnect technology: copper and low-k dielectrics," ICVC '99 6th International Conference on VLSI and CAD, Oct. 26-27, 1999, p. 201.
Wang, G., et al., "Packaging Effects on Reliability of Cu/Low-k Interconnects," IEEE Transactions on Device and Materials Reliability, vol. 3, No. 4, Dec. 2003, pp. 119-128.

(Continued)

Primary Examiner—Cuong Nguyen
(74) Attorney, Agent, or Firm—Cyndi Wheeler

(57) ABSTRACT

Methods and systems for attaching a chip to a next level package by directing radiant energy at the chip back side while substantially preventing irradiation of the next level package are described.

20 Claims, 3 Drawing Sheets

OTHER PUBLICATIONS

Kaushal Verma, Bongtae Han, "Far-Infrared Fizeau Interferometry," Applied Optics, vol. 40 Issue 28, Oct. 2001, p. 4981.

Verma, K. and Han, B., "Warpage Measurement of Dielectric Rough Surfaces of Microelectronics Devices by Far Infrared Fizeau Interferometry," Journal of Electronic Packaging, vol. 122, No. 3, 2000, pp. 227-232.

Goodier, J. N., "Thermal Stresses and Deformations", Journal of Applied Mechanics, vol. 24 No. 3, 1957, pp. 467-474.

Danilovskaya, V. I., "Thermal Stresses in Elastic Half-Space Arising After a Sudden Heating of its Boundary", Prikl. Mat. Mekh, vol. 16, No. 3, 1952, pp. 341-344.

* cited by examiner

RADIANT ENERGY HEATING FOR DIE ATTACH

FIELD OF THE INVENTION

Systems for attaching dies to next level packages are described.

BACKGROUND INFORMATION

Many electronic components include dies, also known as integrated circuit chips, attached to next level packages such as a substrates, interposers, printed circuit boards, etc. A may be attached to a next level package using a flip chip or controlled collapse chip connection C4 technique. In the C4 technique, the die is typically bonded to the next level package with bumps or interconnects formed of solder and aluminum, copper, or other conductive materials. In this technique, the die, interconnects and next level package are heated to form a bond, a process commonly known as reflowing. Heating is typically done by heating the die, next level package, and interconnects simultaneously in a reflow oven at elevated temperatures.

While this approach is effective for bonding the die to the next level package, it can result in mechanical stresses in an assembly so produced due to differing coefficients of thermal expansion between the die and the next level package materials. If the die and the next level package have different coefficients of thermal expansion, they will not expand or contract to the same extent when heated or cooled through the same temperature range in the reflow oven. After bonding, removal from the reflow oven, and cooling, the resulting assembly can thus suffer from residual mechanical stresses which are greater than desired. These stresses can lead to defects in the assembly such as cracks in interlayer dielectric (ILD) layers.

DETAILED DESCRIPTION

In the following description, numerous specific details are set forth. However, it is understood that implementations may be practiced without these specific details. In other instances, well-known circuits, structures and techniques have not been shown in detail in order not to obscure the understanding of this description.

For the purposes of clarity, references may be made to particular materials. However, these references are not intended to be limiting, and implementations of the present invention are applicable to other materials not described herein, unless specifically mentioned otherwise or unless one skilled in the art would know otherwise.

As used herein, "CTE" denotes coefficient of thermal expansion. A coefficient of thermal expansion may be described in a number of ways. One description uses the unit of measure "ppm/degree C.", meaning parts-per-million per degree Centigrade. For example, a material having a CTE of 100 ppm/degree C., when heated through a temperature change of 100 degrees Centigrade, will expand by (10,000/1,000,000), equivalent to a 1% expansion. The use of "CTE" and "ppm/degree C." in this disclosure is simply for explanatory purposes and no limitation is implied by the use of these terms.

As used herein, "die" or "chip" generally refers to integrated circuit devices. Such devices are typically formed on a substrate or base layer including silicon, SOI, glass, germanium, indium telluride, or gallium antimonide, etc., and combinations thereof, to cite just a few examples.

As used herein, "next level package" generally refers to any type of packaging which can be bonded to a die. A next level package may be one or more of: a substrate, a flexible substrate, an interposer, a printed circuit board, etc., and combinations thereof, to cite just a few examples.

As used herein, radiant energy based heating includes heating using lasers, lamps, light sources, and other sources of radiant energy. Radiant energy may be monochromatic or may comprise multiple wavelengths, including ultraviolet, visible, and infrared, and it may be coherent or incoherent. Radiant energy may be supplied continuously or in a pulse or repeated pulses and may be provided directly or through fiber optics, waveguides, lenses, etc.

Figure 1:
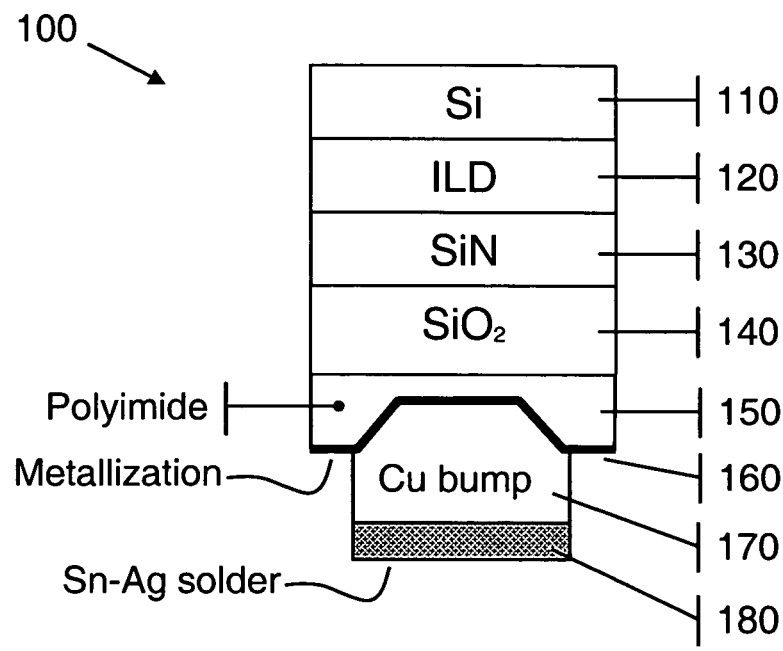
FIG. 1 illustrates an interconnect stack.

FIG. 1 illustrates a model of an interconnect stack 100. Interconnect stack 100 may be formed at a surface of a semiconductor die and may be used to bond the semiconductor die with a next level package. Interconnect stack 100 may exist partly beneath and partly above a surface of a semiconductor die.

Interconnects may be used to couple the semiconductor die with the next level package in a number of ways, including electrical, mechanical, and thermal coupling. Typically, a semiconductor die will have many interconnects. Interconnects may be arranged, for example, in a regular pattern or an array. Interconnects may comprise aluminum and lead-containing solders. In electronic components which are largely lead free, interconnects may comprise copper and silver-tin solder. Where such interconnects are implemented in a flip-chip package, they may result in a connection between the semiconductor die and the next level package which is less compliant than is typical of interconnects comprising aluminum and lead-containing solder. Reduced compliance in the connection may exacerbate stresses resulting from mismatched CTEs.

Interconnect stack 100 is illustrated with silicon layer 110, interlayer dielectric layer 120 (ILD), silicon nitride layer 130, silicon dioxide layer 140, polyimide layer 150, metallization layer 160, copper bump 170, and silver-tin solder 180. Some layers of interconnect stack 100, such as ILD 120, may be mechanically fragile and may crack under residual stresses after a die is attached to a next level package by typical processes, wherein a semiconductor die and a next level package are placed in a reflow oven and brought to reflow temperature. Die attach according to some implementations of the present invention may diminish such stresses and may serve to reduce cracking in ILD 120 or other areas. Note, that while implementations of the methods and systems described and herein may particularly describe interconnects comprising copper and lead free solder, such as interconnect 100, such a description is provided merely for the sake of clarity, and no limitation to these particular materials or structures is implied.

Figure 2:
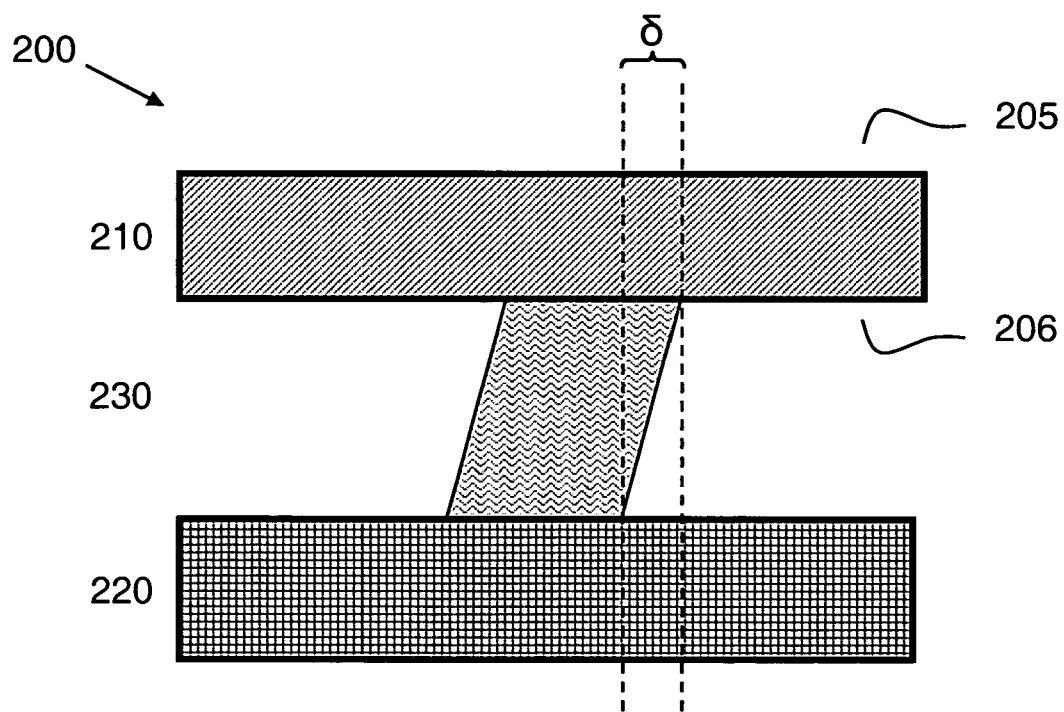
FIG. 2 illustrates a cross section of an interconnect connection between a die and a next level package.

FIG. 2 illustrates a model cross section 200 of an interconnect connection between a semiconductor die 210 and a next level package 220. As illustrated by dotted lines, a difference in CTEs for semiconductor die 210 and next level package 220 can result in a difference in contraction (δ) of next level package 220 relative to semiconductor die 210 when they are cooled from a first uniform temperature to a second uniform temperature. Once semiconductor die 210 is bonded to next level package 220 by an array of interconnects 230, for example an array of solder bumps, the difference in contraction (δ) may result in residual stresses after cooling.

Implementations of the present invention may help ameliorate the difference in contraction (δ) and residual stresses by preferentially heating semiconductor die 210. In some implementations, die 210 is heated by directing radiant energy at its backside 205. This heating may raise the temperature of die 210 and interconnects 230 to the point where the interconnect 230 solder joints reflow, without bringing the temperature of the entire next level package 220 up to that point. Because the CTE of next level package 220 is typically greater than that of semiconductor die 210, not raising the temperature of the entire next level package 220 to the solder reflow temperature may result in a lessening of the expansion of next level package 220 relative to semiconductor die 210. Thus, upon cooling to a uniform temperature such as room temperature, the difference in contraction (δ) may be reduced relative to that obtained by typical processes. Note, however, that the descriptions provided herein describe particular materials and structures simply for clarity and ease of explanation. Systems and methods described are applicable to a wide variety of systems including those wherein CTEs differ from those described and those wherein no difference in CTEs exists.

Figure 3:
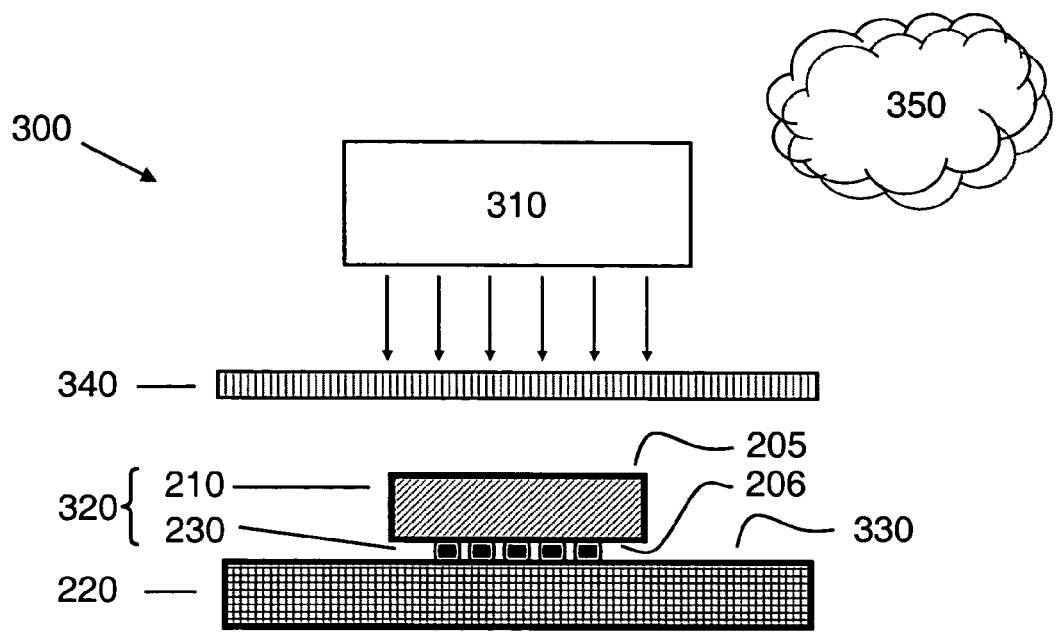
FIG. 3 illustrates an implementation of a system for chip attach.

FIG. 3 depicts a system 300 for attaching a semiconductor die 210 to a next level package 220 according to an implementation of the present invention. Semiconductor die 210 may have interconnects 230 formed thereon to create die-interconnect combination 320. Die-interconnect combination 320 may be arranged with next level package 220 so that interconnects 230 are interposed between die 210 and next level package 220 and in contact with both. Other configurations of die 210, interconnects 230, and next level package 220 may likewise be treated using this approach. Interconnects 230 may comprise a solder alloy, or may comprise a combination of copper and solder, and interconnects 230 may be formed on next level package 220 rather than on die 210, or interconnects 230 may be formed on both die 210 and next level package 220, for example in matching arrays.

Next level package 220 may include, for example, an epoxy resin material such as FR4 glass epoxy having a CTE of approximately 16 ppm/degree C., and may contain wiring and/or circuitry. Semiconductor die 210 may include, for example, silicon having a CTE of approximately 3 ppm/degree C. Interconnects 230 may be, for example, in the form of an array of solder bumps disposed on front side 206 of die 210 and may comprise copper. Those skilled in the art will appreciate that materials other than those described herein may be used, and implementations of the present invention are not limited to these materials.

Radiant energy source 310 may take a number of forms. Exemplary sources include lamps and lasers, though other sources are also suitable. In some implementations, radiant energy source 310 may be a laser which emits energy in the infrared spectrum. Radiant energy source 310 may be a carbon dioxide laser emitting infrared light with a wavelength of about 10.6 microns. In some implementations, source 310 may be a laser which emits energy in the ultraviolet spectrum. Radiant energy source 310 may be a YAG laser emitting light with a wavelength of about 1 micron. Where radiant energy source 310 is a laser, it may provide power of about 10 to 20 watts/square centimeter or more. In some implementations, radiant energy source 310 may be a visible light source. Radiant energy source 310 may be maintained stationary relative to die 210, or may move relative to it to allow for more uniform heating of back side 205 of die 210. Relative motion may be provided by, for example, a movable jig holding die 210 and next level package 220, by movable fiber optics carrying light, by electromagnetic fields, etc.

Radiant energy source 310 is arranged so as to be capable of irradiating back side 205 of die 210. Radiant energy source 310 may be arranged so as to directly irradiate back side 205 of die 210, such as by being positioned directly above it. Alternatively, radiant energy source 310 may be remote from die 210 and may coupled to a light pipe, fiber optics, or other means for directing radiant energy from radiant energy source 310 to back side 205 of die 210.

In some implementations, radiant energy source 310 is directed substantially to back side 205 while only irradiating surface 330 of next level package 220 to a limited degree. In some implementations, heating back side 205 may result in die 210 being hotter than next level package 220 during reflow. Radiant energy emitted from source 310 may be in the nature of a beam having a cross section of from about 15 square millimeters to about 2,600 square millimeters. In some implementations, radiant energy source 310 does not irradiate surface 330 of next level package 220. This may be achieved, for example, by focusing radiant energy source 310 on back side 205 of die 210, and/or by masking or shielding next level package 220. Focusing, masking, shielding, etc., may be achieved by interposing element 340 in a path of the radiant energy.

Element 340 may include lenses, reflectors, masks, electromagnetic fields, etc., which are capable of controlling the passage of radiant energy from source 310 to back side 205 and/or surface 330. For example, element 340 may comprise a mask which substantially blocks radiant energy from impinging on surface 330 while allowing radiant energy to impinge on back side 205. In some implementations, element 340 may comprise an electromagnetic field acting as a lens.

In some implementations, the temperature of the ambient atmosphere 350 of system 300 may be limited. While any suitable arrangement may be used, limits may be provided by exemplary controls such as fans, refrigeration devices, etc. Limiting the temperature of the ambient atmosphere 350 may reduce the temperature of next level package 220 during bonding and may thereby reduce its expansion due to heating. This may assist in minimizing the difference in contraction (δ) between next level package 220 and semiconductor die 210. In some implementations, the temperature of ambient atmosphere 350 may be limited to about 100 degrees centigrade or lower.

Figure 4:
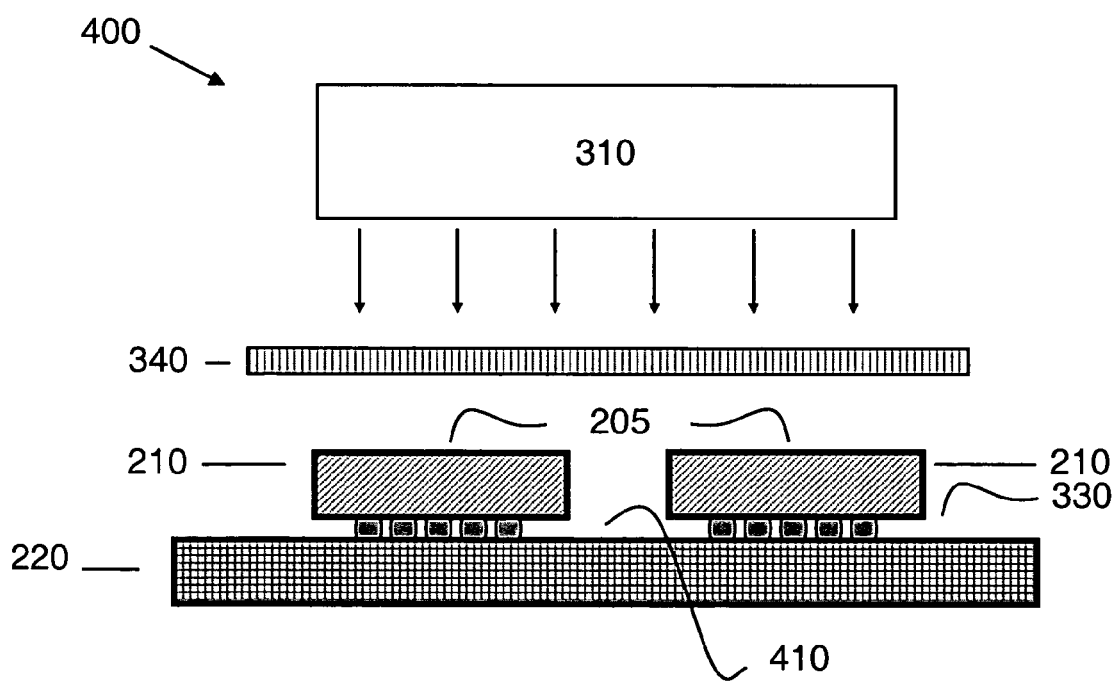
FIG. 4 illustrates an implementation of a system for multiple chip attach.

FIG. 4 depicts a system 400 for attaching multiple semiconductor dies 210 to next level package 220 according to an implementation of the present invention. Dies 210 may be attached sequentially or simultaneously. Radiant energy source 310 may be arranged so as to be capable of irradiating one or more back sides 205 of one or more dies 210. Radiant energy source 310 may be maintained stationary relative to back sides of die 210, or may move relative to them. Relative motion may be provided by, for example, a movable jig holding die 210 and next level package 220, by movable fiber optics carrying light, by electromagnetic fields, etc. Radiant energy source 310 may emit radiant energy continuously, in a pulsed fashion, or in any other suitable fashion.

Radiant energy emitted from source 310 may be managed by element 340, such as by blocking or redirecting the radiant energy. In some embodiments, radiant energy source 310 supplies radiant energy via element 340 to back sides 205 of semiconductor dies 210 while element 340 controls the radiant energy so as to substantially prevent radiant energy from impinging on surface 330 of next level package 220, including in space 410. For example, element 340 may comprise a shade or shutter which allows radiant energy to impinge on one or more back sides 205 while substantially blocking radiant energy from impinging on surface 330 of next level package 220, for example at a periphery of next level package 220 or in space 410 between semiconductor dies 210.

Figure 5:
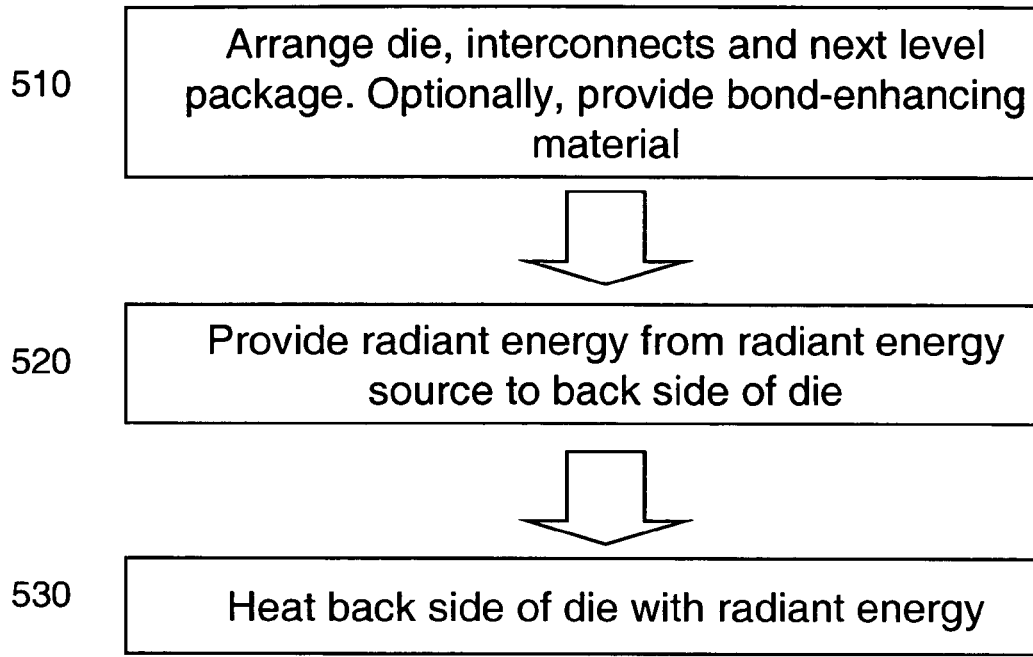
FIG. 5 is a flow chart illustrating chip attach.

FIG. 5 is a flow chart describing an implementation of a method for die attach. In this implementation, a source of radiant energy 310 is directed at backside 205 of a semiconductor die 210 to heat die 210 and interconnects 230 to the solder reflow temperature to thereby bond die 210 with next level package 220. Radiant energy based heating may allow die 210 to be preferentially heated, thereby helping to ameliorate the effects of different CTEs of die 210 and next level package 220.

Semiconductor die 210 may be manufactured, for example, to include low-k dielectrics, copper bumps, and silver-tin solder in interconnects 230, though implementations of the present invention are not restricted to dies or interconnects of those types and are applicable to a wide range of possible dies and interconnects. Next level package 220 may be, for example, an organic substrate of a material such as FR4, though implementations of the present invention are not restricted to next level packages of this type and are applicable to a wide range of possible next level packages and materials including ceramic substrates, interposers, and printed circuit boards.

Figure 6:
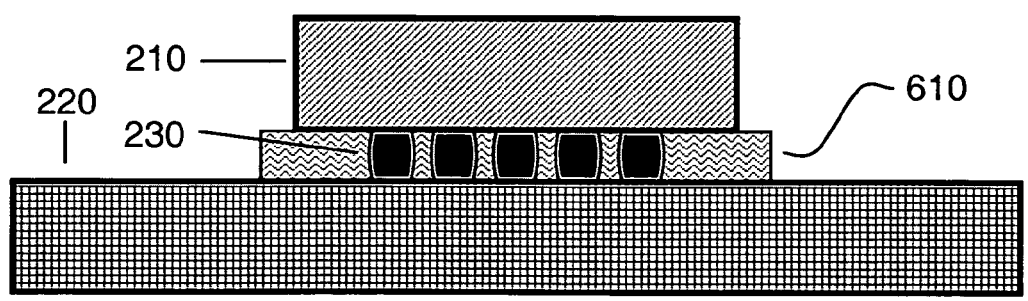
FIG. 6 illustrates an implementation comprising a bond enhancing material.

In Block 510 of FIG. 5, semiconductor die 210 is arranged with next level package 220 such that interconnects 230 are disposed between die 210 and next level package 220 and in contact with both. Interconnects 230 may comprise, for example, copper bumps, solder bumps, C4 joints, etc., and methods described herein are suitable for other arrangements as well. For example, solder bumps may be present on next level package 220. Optionally, as shown in FIG. 6, a suitable bond enhancing material 610 may be provided. Material 610 may comprise, for example, a chemical soldering flux which may be applied to some portion of surface 330 or to interconnects 230. Optionally, material 610 may comprise a suitable no-flow underfill which may be applied to a portion of surface 330 or to interconnects 230. Chemical flux in material 610 may have a boiling point near to or above the interconnect 230 solder joint reflow temperature. In addition to other effects, a chemical flux having such a boiling point may improve heat transfer from die 210 to interconnects 230 and next level package 220. Likewise, where material 610 comprises a no-flow underfill, it may improve heat transfer from die 210 to interconnects 230 and next level package 220.

In Block 520, radiant energy source 310 provides energy to back side 205 of die 210. Radiant energy source 310 provides radiant energy based heating of semiconductor die 210. The exact nature of radiant energy source 310 will depend, in part, on the nature of die 210 and the requirements of the manufacturing process. Exemplary radiant energy sources 310 include lamps and lasers, though other sources are also suitable. Exemplary arrangements for radiant energy source 310 include configurations which allow radiant energy to directly irradiate semiconductor die 210 as well as configurations wherein radiant energy source 310 is remote from die 210 and radiant energy is directed to back side 205 of die 210 by element 340, which may comprise light pipes, lenses, mirrors, optical fibers, electromagnetic fields, etc.

Radiant energy source 310 provides radiant energy to back side 205 of die 210 in a manner which allows for rapid heating of semiconductor die 210 without concomitant rapid heating of next level package 220. Radiant energy may be directed at all of back side 205, or at only a portion of back side 205. It is not necessary that radiant energy source 310 be capable of irradiating interconnects 230 directly. In some implementations, radiant energy source 310 will irradiate some or all of back side 205 of die 210, without substantially irradiating surface 330 of next level package 220, such as by providing a beam which is smaller than or equal to the size of die 210 and which does not irradiate surface 330. This may be achieved, for example, by directing a laser beam having a diameter of 5 millimeters at the center of back side 205 of a die 210 having dimensions of 10 millimeters by 10 millimeters.

Control element 340 may be provided to limit radiant energy to back side 205 of die 210, substantially preventing radiant energy from impinging on surface 330 of next level package 220. It may be desirable to treat surface 330 of next level package 220 so as to reduce the heating effect of radiant energy impinging thereon. For example, surface 330 may be treated by applying a coating or cover which prevents radiant energy from heating next level package 220.

If die 210 is constructed in a manner that causes radiant energy to reflect from it, it may be desirable to enhance the ability of radiant energy source 310 to heat die 210 by treating back side 205 of die 210. Suitable treatments may include applying a susceptor material (not shown) to back side 205. For example, if die 210 has a gold layer on back side 205, it may be desirable to coat back side 205 with a ceramic material that absorbs radiant energy and is heated by it. Such a treatment may improve the ability of radiant energy source 310 to heat die 210.

In Block 530 of FIG. 5, radiant energy source 310 irradiates back side 205 of semiconductor die 210 so as to rapidly heat it and bond it to next level package 220. Radiant energy based rapid heating of die 210 may result in heat transfer to interconnect 230 solder joints that raises their temperature to their reflow temperature without raising the temperature of the whole next level package 220 to that temperature.

Energy delivered by radiant energy source 310 to back side 205 of semiconductor die 210 may result in heat transfer from die 210 to interconnects 230 and to next level package 220, raising their temperatures. The rate of heat transfer depends, in part, on the intensity of the radiant energy provided by source 310. Preferably, the rate of heat transfer will be maximized by providing radiant energy intense enough to rapidly bring interconnect 230 solder joints to their reflow temperature, yet no so intense that die 210 is heated too much, since excessive temperatures may damage die 210. Preferably, radiant energy source 310 delivers radiant energy to back side 205 of semiconductor die 210 quickly enough to ensure heating die 210 and interconnect 230 solder joints while avoiding excessive heat transfer to next level package 220. Excessive heat transfer to next level package 220 may raise the temperature of next level package 220 to the point that, upon cooling, residual stresses may cause defects such as cracking in interlayer dielectric layers of die-interconnect combination 320. In some implementations, radiant energy may be delivered to back side 205 for about 1 second, or less. In some implementations, die 210 may be heated at about 200 degrees centigrade per second.

Die 210 may absorb radiant energy from source 310, so that radiant energy applied to back side 205 of die 210 may heat die 210. As die 210 is heated, it may, in turn, transfer heat to interconnects 230, such as by convection or conduction. Radiant energy applied to back side 205 of die 210 may be in the form of, for example, a beam having a diameter significantly larger than that of an individual interconnect 230. Where radiant energy is applied to back side 205 in such a way that it impinges on only a subsection of back side 205, for example where a laser beam having a 5 mm diameter irradiates part of a 10 mm×10 mm die 210, convection or conduction within die 210 may serve to raise the temperature of non-irradiated parts of die 210. Heat transferred from die 210 to interconnects 230 may then raise their temperature to their solder joint reflow point in order to form bonds with next level package 220. Thus, interconnects 230 may be heated to their solder joint reflow temperature without irradiating all of back side 205 of die 210 and without irradiating interconnects 230 directly. In contrast to typical laser-based heating systems, this may allow for bonding of die-interconnect combinations 320 in which interconnects 230 are inaccessible or are otherwise obscured by die 210 or other components mounted on next level package 220.

Implementations described herein may require attention to the intensity of radiant energy source 310, the reflow temperature of the interconnect 230 solder joints, and the maximum temperature die 210 should sustain. The choice and application of a radiant energy source 310 for bonding a given die-interconnect combination 320 with a next level package 220 may also require attention to a variety of other factors such as duration of heating, reflectivity of back side 205 of die 210, effects of susceptors, if any, applied to back side 205, the rate of heating of die 210 and interconnects 230, rate of heating of next level package 220, heat loss to the ambient environment, and heat gradients across die 210 and/or interconnects 230, among others. The effects of these factors on a given implementation may be modeled using finite element analyses, also known as the finite element method.

Finite element method modeling is most effective when the model closely matches the real structure. Since methods and systems described herein are applicable to a large variety of possible structures, those skilled in the art will appreciate that the general guidelines for finite element method provided herein must be combined with information derived from the actual structures being processed. Thus, this discussion is merely meant to outline an approach to modeling.

Finite element method thermal and structural modeling may be performed with the objectives of estimating ideal operating parameters, estimating the temperature history and distribution in the system, and examining the influences of processing parameters on residual stresses. Modeling may be performed with a general purpose program such as ABAQUS. Thermal and structural modeling may be performed separately. For example, thermal modeling may be performed first, allowing use of the results of that modeling in setting boundary conditions for the structural modeling.

Model elements for thermal modeling may include, for example, models of semiconductor die 210, interconnect 230 features such as copper bumps and solder balls, and models of next level package 220. Each may be modeled as two-dimensional heat transfer elements. The boundary condition for energy input from radiant energy source 310 may be modeled as a spatially uniform transient heat flux applied over back side 205 of die 210. Boundary conditions for ambient convection may include convection along edges of die 210, edges of next level package 220, the surface of next level package 220 opposite surface 330, and any portion of surface 330 facing die 210 but not covered by it. In some instances, it may also be desirable to model convection at surface 330 in the space 410 between multiple dies 210.

For structural modeling, it is preferable to employ a global-local approach, in which the global model uses elements from the thermal modeling (e.g., models of die 210, copper bumps and solder balls of interconnects 230, and next level package 220). The local model may be a more detailed examination of the smaller elements making up the outermost interconnects 230 on die 210.

For example, the local model may model a subset of interconnects 230, such as three outer interconnect joints, since these interconnect joints may be where defects are most likely to arise. Thus, where modeling a semiconductor die-interconnect combination 320 comprising a fragile low-k interlayer dielectric such as ILD 120, a detailed examination of the outermost interconnects is preferably performed to estimate stresses on ILD 120 in those areas. Smaller elements of the local model may similarly include other elements, for example various layers of interconnect stack 100 and other dielectric layers, traces, or interconnects at front side 206 of semiconductor die 210. The material properties assigned to components of the system to be modeled are preferably measured experimentally.

Finite element method modeling may be refined by performing one or more experiments to compare aspects of modeling with actual results. Thus, it may be preferable to conduct experiments which correlate the actual heat flux through semiconductor die 210 with modeled results. As an example, it may be preferable to measure the temperature at the front side 206 of die 210 while heating die 210 with radiant energy supplied by source 310. Convection coefficients employed in the thermal modeling may then be adjusted so as to match observed experimental results.

Finite element method modeling may be used to estimate the radiant energy input required to achieve rapid heating of die 210 and to achieve solder reflow of all interconnect 230 solder joints. For a given radiant energy pulse duration from source 310, modeling may provide information comparing radiant energy input to back side 205 of die 210 with the maximum temperature of die 210 and with the minimum temperatures at the chosen subset of interconnects 230, for example the outermost interconnects. These maximum and minimum temperatures may result in an estimate of the upper and lower operational limits for energy input to back side 205 of die 210. Thus, initial operating conditions for radiant energy based heat input may be set between these upper and lower limits.

Finite element method modeling may also be employed to estimate residual stresses in a die-next level package assembly after chip attach and cooling. For example, modeling may be employed to estimate the difference in contraction (δ) of model 200. This may allow for a correlation between the modeled operating conditions and the expected residual stresses, and may thus enable predictions about the effects of operating conditions on the potential occurrence of defects such as cracking in ILD 120 at a subset of interconnects 230, such as a set of outermost interconnects.

Empirical analysis of die-next level package assemblies produced through radiant energy heating may be used to confirm predictions made by finite element modeling and also may be used to further tailor methods and systems described herein to more particularly suit the actual dies 210 and next level packages 220 that are to be bonded. For example, die 210 warpage measurements are indicative of the existence and magnitude of residual stresses in the assemblies and of the potential occurrence of defects such as cracking of ILD layers 120 at outermost interconnects 230. Die 210 warpage measurements may be made, for example, with a Fizeau interferometer.

Visual examination of cross sections through actual bonded die-next level package assemblies and electrical measurements on interconnects 230, test loops, or similar structures may likewise be employed to verify electrical continuity of die-next level package connections, particularly those at outer edges of the assemblies. These measurements can be used to confirm that heating at the outer edges was adequate to reflow the interconnect 230 solder joints there.

The foregoing detailed description and accompanying drawings are only illustrative and not restrictive. They have been provided primarily for a clear and comprehensive understanding of the disclosed implementations and no unnecessary limitations are to be understood therefrom. Numerous additions, deletions, and/or modifications to the implementations described herein, as well as alternative arrangements, may be devised by those skilled in the art without departing from the spirit of the disclosed implementations and the scope of the appended claims.

What is claimed is:

1. A chip attach system, comprising:
    a chip having a back side, a front side, and at least one interconnect formed at the front side;
    a next level package;
    a source to provide radiant energy to the back side of the chip; and
    a control element to substantially prevent radiant energy from irradiating the next level package, wherein the control element is positioned between the source and the back side of the chip, and, wherein the chip, the at least one interconnect, and the next level package are arranged so that the chip front side faces the next level package and the at least one interconnect is in contact with the next level package.

2. The chip attach system of claim 1, wherein the radiant energy provided to the back side of the chip irradiates a substantial portion of the back side of the chip simultaneously.

3. The chip attach system of claim 2, wherein the radiant energy irradiates more than one-half of the back side of the chip simultaneously.

4. The chip attach system of claim 1, wherein the control element comprises a mask, reflector, or lens.

5. The chip attach system of claim 4, wherein the control element comprises a mask which substantially blocks radiant energy from the next level package.

6. The chip attach system of claim 1, wherein the source has a power of about 10 watts per square centimeter or more.

7. A chip attach system, comprising:
    a chip having an outer boundary;
    a next level package extending laterally beyond the outer boundary of the chip;
    interconnects between the chip and the next level package; and
    a source to provide substantially more radiant energy to a surface of the chip opposite the interconnects than to the next level package around the outer boundary of the chip.

8. The chip attach system of claim 7, wherein the radiant energy is predominantly incident on the chip and irradiates a substantial portion of the back side of the chip simultaneously.

9. The chip attach system of claim 8, wherein the radiant energy irradiates more than one-half of the back side of the chip simultaneously.

10. The chip attach system of claim 7, wherein the source comprises a laser emitting radiant energy having a cross section that is substantially greater than a cross section of the interconnects.

11. A chip attach system, comprising:
    a next level package having an ambient temperature;
    a chip disposed on a surface of the next level package; and
    a source to provide radiant energy to heat the chip substantially above the ambient temperature of the next level package.

12. The chip attach system of claim 11, further comprising interconnects formed at a surface of the chip, wherein the ambient temperature of the next level package is maintained below a reflow temperature of the interconnects.

13. The chip attach system of claim 11, wherein the source is a laser directed at a surface of the chip opposite the surface of the next level package.

14. The chip attach system of claim 13, wherein the radiant energy is predominantly incident on the surface of the chip that is opposite the surface of the next level package.

15. The chip attach system of claim 14, wherein the loser has a power of about 10 watts per square centimeter or more.

16. The chip attach system of claim 11, further comprising a susceptor material deposited at a surface of the chip.

17. A chip attach system, comprising:
    a next level package having a plurality of chips disposed on a surface of the next level package;
    a source to provide radiant energy; and
    a control element in a path of the radiant energy and arranged to permit the radiant energy to irradiate the plurality of chips and to substantially prevent the radiant energy from irradiating the surface of the next level package.

18. The chip attach system of claim 17, wherein the control element comprises a mask.

19. The chip attach system of claim 17, wherein the radiant energy irradiates the plurality of chips substantially simultaneously.

20. The chip attach system of claim 19, further comprising multiple sources of radiant energy.

* * * * *

UNITED STATES PATENT AND TRADEMARK OFFICE
CERTIFICATE OF CORRECTION

PATENT NO. : 7,187,066 B2  Page 1 of 1
APPLICATION NO. : 10/947515
DATED : March 6, 2007
INVENTOR(S) : Frutschy It is certified that error appears in the above-identified patent and that said Letters Patent is hereby corrected as shown below:

In column 10, at line 39, delete "loser" and insert --laser--.

Signed and Sealed this

Fifteenth Day of April, 2008

JON W. DUDAS
*Director of the United States Patent and Trademark Office*